(12) United States Patent
 Akatsu

(10) Patent No.: US 11,145,845 B2
(45) Date of Patent: Oct. 12, 2021

(54) ORGANIC DEVICE MANUFACTURING METHOD

(71) Applicant: SUMITOMO CHEMICAL COMPANY, LIMITED, Tokyo (JP)

(72) Inventor: Mitsutoshi Akatsu, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 22 days.

(21) Appl. No.: 16/762,027

(22) PCT Filed: Nov. 7, 2018

(86) PCT No.: PCT/JP2018/041319
§ 371 (c)(1),
(2) Date: May 6, 2020

(87) PCT Pub. No.: WO2019/093366
PCT Pub. Date: May 16, 2019

(65) Prior Publication Data
US 2020/0381673 A1 Dec. 3, 2020

(30) Foreign Application Priority Data
Nov. 8, 2017 (JP) .............................. JP2017-215643

(51) Int. Cl.
*H01L 21/00* (2006.01)
*H01L 51/56* (2006.01)
*H01L 51/50* (2006.01)

(52) U.S. Cl.
CPC .......... *H01L 51/56* (2013.01); *H01L 51/5024* (2013.01)

(58) Field of Classification Search
CPC . H01L 51/56; H01L 51/5024; H01L 51/5012; H01L 2251/55; H01L 2251/562; H05B 33/10
See application file for complete search history.

(56) References Cited

U.S. PATENT DOCUMENTS 8,138,364 B2 * 3/2012 Marks .................. C23C 16/407
556/130
9,102,872 B2 * 8/2015 Ueno .................. C09K 11/671
(Continued)

FOREIGN PATENT DOCUMENTS

EP  2 533 609 A1  12/2012
JP  2004-55333 A  2/2004
(Continued)

OTHER PUBLICATIONS

Japanese Office Action, dated Jul. 31, 2018, for Japanese Application No. 2017-215643, with an English Translation.
(Continued)

*Primary Examiner* — Caleb E Henry
(74) *Attorney, Agent, or Firm* — Birch, Stewart, Kolasch & Birch, LLP

(57) ABSTRACT

A method for producing an organic device includes a first forming step and a second forming step, and wherein an upper limit value of an integrated illuminance of light in an environment until formation of a second electrode layer (15) starts after formation of a light emitting layer (11) starts is set, and an organic functional layer is formed so that the integrated illuminance is the upper limit value or less, and wherein the upper limit value of the integrated illuminance at which a product lifespan is a predetermined time or longer is set on the basis of a relationship of the integrated illuminance with relative lifespan and relative current luminous efficiency so that the product lifespan of an organic device (1) set based on the relative lifespan and the relative current luminous efficiency caused by the integrated illuminance is the predetermined time or longer.

8 Claims, 9 Drawing Sheets

(56) References Cited

U.S. PATENT DOCUMENTS

| | | | |
|---|---|---|---|
| 9,755,173 B2* | 9/2017 | Riegel | H01L 51/5268 |
| 10,840,465 B2* | 11/2020 | Jung | H01L 51/524 |
| 2004/0144975 A1* | 7/2004 | Seki | H01L 51/0007 |
| | | | 257/40 |
| 2006/0043386 A1* | 3/2006 | Furukawa | H01L 33/20 |
| | | | 257/79 |
| 2008/0100206 A1* | 5/2008 | Kondo | H01L 51/0003 |
| | | | 313/504 |
| 2010/0045174 A1* | 2/2010 | Okabe | H05B 33/14 |
| | | | 313/504 |
| 2012/0037894 A1 | 2/2012 | Okabe | |
| 2013/0048962 A1 | 2/2013 | Kakimoto et al. | |
| 2013/0062596 A1* | 3/2013 | Ando | H01L 51/0004 |
| | | | 257/40 |
| 2015/0311443 A1* | 10/2015 | Goto | H01L 51/0022 |
| | | | 257/40 |
| 2015/0349197 A1* | 12/2015 | Watanabe | H01L 33/06 |
| | | | 257/13 |
| 2016/0155988 A1* | 6/2016 | Kuroki | H01L 51/5268 |
| | | | 257/40 |
| 2016/0326275 A1* | 11/2016 | Ashikaga | B01J 19/128 |
| 2017/0229680 A1 | 8/2017 | Nanno et al. | |
| 2018/0175298 A1* | 6/2018 | Sassa | H01L 51/0097 |
| 2018/0198095 A1* | 7/2018 | Sassa | H01L 51/0002 |
| 2018/0261773 A1* | 9/2018 | Yamamoto | H01L 51/0054 |

FOREIGN PATENT DOCUMENTS

| | | |
|---|---|---|
| JP | 2017-22068 A | 1/2017 |
| WO | WO 2010/104184 A1 | 9/2010 |
| WO | WO 2011/096509 A1 | 8/2011 |

OTHER PUBLICATIONS

English translation of the International Search Report for International Application No. PCT/JP2018/041319, dated Dec. 11, 2018.
International Preliminary Report on Patentability and English translation of the Written Opinion of the International Searching Authority for International Application No. PCT/JP2018/041319, dated May 12, 2020.

* cited by examiner

*Fig.7*

| | ILLUMINANCE | ILLUMINATION TIME | INTEGRATED ILLUMINANCE | RELATIVE CURRENT LUMINOUS EFFICIENCY | RELATIVE LIFESPAN |
|---|---|---|---|---|---|
| | (lx) | (hrs) | (lx·hrs) | (%) | (%) |
| 1 | 0 | 0 | 0 | 100 | 100 |
| 2 | 39 | 0.5 | 20 | 104 | 91 |
| 3 | 70 | 1 | 70 | 90 | 65 |
| 4 | 70 | 4 | 280 | 83 | 23 |
| 5 | 100 | 0.5 | 50 | 92 | 64 |
| 6 | 100 | 1 | 100 | 84 | 45 |
| 7 | 100 | 4 | 400 | 69 | 19 |

Fig.9

| INTEGRATED ILLUMINANCE (lx·hrs) | RELATIVE CURRENT LUMINOUS EFFICIENCY (%) | RELATIVE LIFESPAN (%) | PRODUCT LIFESPAN (khrs) |
|---|---|---|---|
| 0 | 100 | 100 | 140 |
| 20 | 104 | 91 | 138 |
| 50 | 92 | 65 | 77 |
| 70 | 90 | 65 | 74 |
| 100 | 84 | 45 | 44 |
| 280 | 83 | 23 | 22 |
| 400 | 69 | 19 | 7 |

ORGANIC DEVICE MANUFACTURING METHOD

TECHNICAL FIELD

The present invention relates to a method for producing an organic device.

BACKGROUND ART

Regarding a conventional method for producing an organic device, for example, a method described in Patent Literature 1 is known. In the method for producing an organic device described in Patent Literature 1, a light emitting layer containing an arylamine compound is formed into a wet film under a light environment that does not include a wavelength of 500 nm or less.

CITATION LIST

Patent Literature

[Patent Literature 1] PCT International Publication No. WO2010/104184

SUMMARY OF INVENTION

Technical Problem

A light emitting layer has a risk of deterioration of characteristics when light enters. Therefore, as in the above conventional method for producing an organic device, the light emitting layer is formed under a light environment in which a wavelength of 500 nm or less is blocked (under a yellow light environment). In such an environment, when yellow light (which may include other light) enters the light emitting layer, compared to when no yellow light enters the light emitting layer, characteristics of the organic device may deteriorate and the reliability may be reduced. Therefore, in production of the light emitting layer of the organic device, further improvement in a step of forming an organic functional layer including a light emitting layer is required.

An object of one aspect of the present invention is to provide a method for producing an organic device through which it is possible to reduce a decrease in the reliability.

Solution to Problem

A method for producing an organic device according to one aspect of the present invention includes a first forming step of forming an organic functional layer including at least a light emitting layer on a first electrode layer disposed on a substrate; and a second forming step of forming a second electrode layer on the organic functional layer, wherein an upper limit value of an integrated illuminance of light in an environment until formation of the second electrode layer starts in the second forming step after formation of the light emitting layer starts in the first forming step is set and the organic functional layer is formed so that the integrated illuminance is the upper limit value or less, and wherein the upper limit value of the integrated illuminance at which the product lifespan is a predetermined time or longer is set on the basis of a relationship of the integrated illuminance with relative lifespan and relative current luminous efficiency so that the product lifespan of the organic device set based on the relative lifespan and the relative current luminous efficiency caused by the integrated illuminance is the predetermined time or longer.

In the method for producing an organic device according to one aspect of the present invention, the upper limit value of the integrated illuminance of light in an environment until formation of the second electrode layer starts after formation of the light emitting layer starts is set on the basis of the relationship of the integrated illuminance with relative lifespan and relative current luminous efficiency so that the product lifespan of the organic device is the predetermined time or longer. Then, the organic functional layer is formed so that the integrated illuminance is the upper limit value or less. Thereby, in the method for producing an organic device, it is possible to produce an organic device having a product lifespan of a predetermined time or longer. Therefore, in the method for producing an organic device, it is possible to reduce a decrease in the reliability.

In one embodiment, if the product lifespan of the organic device when the integrated illuminance is 0 is set as $LT_0$, a relative lifespan at the integrated illuminance when the light enters the organic device for a predetermined time t is set as $\Delta LT_t$, and a relative current luminous efficiency at the integrated illuminance when the light enters the organic device for the predetermined time t is set as $\Delta \mathrm{Eff}_t$, the product lifespan LT of the organic device may be calculated from the following formula:

$$LT=(LT_0)\times\Delta LT_t\times(\Delta\mathrm{Eff}_t)^2$$

Accordingly, the upper limit value of the integrated illuminance can be accurately set because the product lifespan LT of the organic device can be accurately calculated.

In one embodiment, the upper limit value of the integrated illuminance may be 100 lx·hrs or less. Thereby, it is possible to produce an organic device having a product lifespan of, for example, 40,000 hours.

A method for producing an organic device according to one aspect of the present invention includes a first forming step of forming an organic functional layer including at least a light emitting layer on a first electrode layer disposed on a substrate; and a second forming step of forming a second electrode layer on the organic functional layer, wherein the organic functional layer is formed so that the integrated illuminance of light in an environment until formation of the second electrode layer starts in the second forming step after formation of the light emitting layer in the first forming step starts is 100 lx·hrs or less.

In the method for producing an organic device according to one aspect of the present invention, the organic functional layer is formed so that the integrated illuminance of light in an environment until formation of the second electrode layer starts after formation of the light emitting layer starts is 100 lx·hrs or less. Thereby, in the method for producing an organic device, it is possible to produce an organic device having a product lifespan of, for example, 40,000 hours. Therefore, in the method for producing an organic device, it is possible to reduce a decrease in the reliability.

A method for producing an organic device according to one aspect of the present invention includes a first forming step of forming an organic functional layer including at least a light emitting layer on a first electrode layer disposed on a substrate; and a second forming step of forming a second electrode layer on the organic functional layer, wherein an upper limit value of an integrated absorption irradiance of light in an environment until formation of the second electrode layer starts in the second forming step after formation of the light emitting layer starts in the first forming step is set, and the organic functional layer is formed so that the integrated absorption irradiance is the upper limit value or less, wherein the integrated absorption irradiance is an integrated value of integrated irradiances for wavelengths of the light of a material that forms the light emitting layer, and wherein the upper limit value of the integrated absorption irradiance at which a product lifespan is a predetermined time or longer is set on the basis of a relationship of the integrated absorption irradiance with relative lifespan and relative current luminous efficiency so that the product lifespan of the organic device set based on the relative lifespan and the relative current luminous efficiency caused by the integrated absorption irradiance is the predetermined time or longer.

In the method for producing an organic device according to one aspect of the present invention, the upper limit value of the integrated absorption irradiance of light in an environment until formation of the second electrode layer starts after formation of the light emitting layer starts is set on the basis of the relationship of the integrated absorption irradiance with relative lifespan and relative current luminous efficiency so that the product lifespan of the organic device is a predetermined time or longer. Then, the organic functional layer is formed so that the integrated absorption irradiance is the upper limit value or less. Thereby, in the method for producing an organic device, it is possible to produce an organic device having a product lifespan of a predetermined time or longer. Therefore, in the method for producing an organic device, it is possible to reduce a decrease in the reliability.

In one embodiment, a wavelength of at least one peak of an emission spectrum of the light may be within a distribution of an absorption spectrum of the material that forms the light emitting layer. In this manner, when a peak wavelength of an emission spectrum of light is included in the distribution of the absorption spectrum of the material that forms the light emitting layer, the method for producing an organic device is particularly effective.

In one embodiment, the light may not have a wavelength range of 500 nm or less. In production of the organic device, a material having high sensitivity in a short wavelength range may be used. Therefore, when so-called yellow light in which light having a wavelength shorter than 500 nm is cut is used, since it is possible to minimize a reaction of a material having high sensitivity in a short wavelength range, it is possible to prevent light from affecting characteristics of the organic device.

In one embodiment, the upper limit value of the integrated illuminance may be set based on a spectrum of light that enters the organic functional layer and an absorption spectrum of a material of the organic functional layer. Thereby, the upper limit value of the integrated illuminance can be set more accurately.

Advantageous Effects of Invention

According to one aspect of the present invention, it is possible to reduce a decrease in the reliability of the organic device.

BRIEF DESCRIPTION OF DRAWINGS

FIG. 7 is a table showing a relationship of an integrated illuminance with relative lifespan and relative current luminous efficiency.

FIG. 9 is a table showing a relationship between an integrated illuminance and a product lifespan.

DESCRIPTION OF EMBODIMENTS

Figure 1:
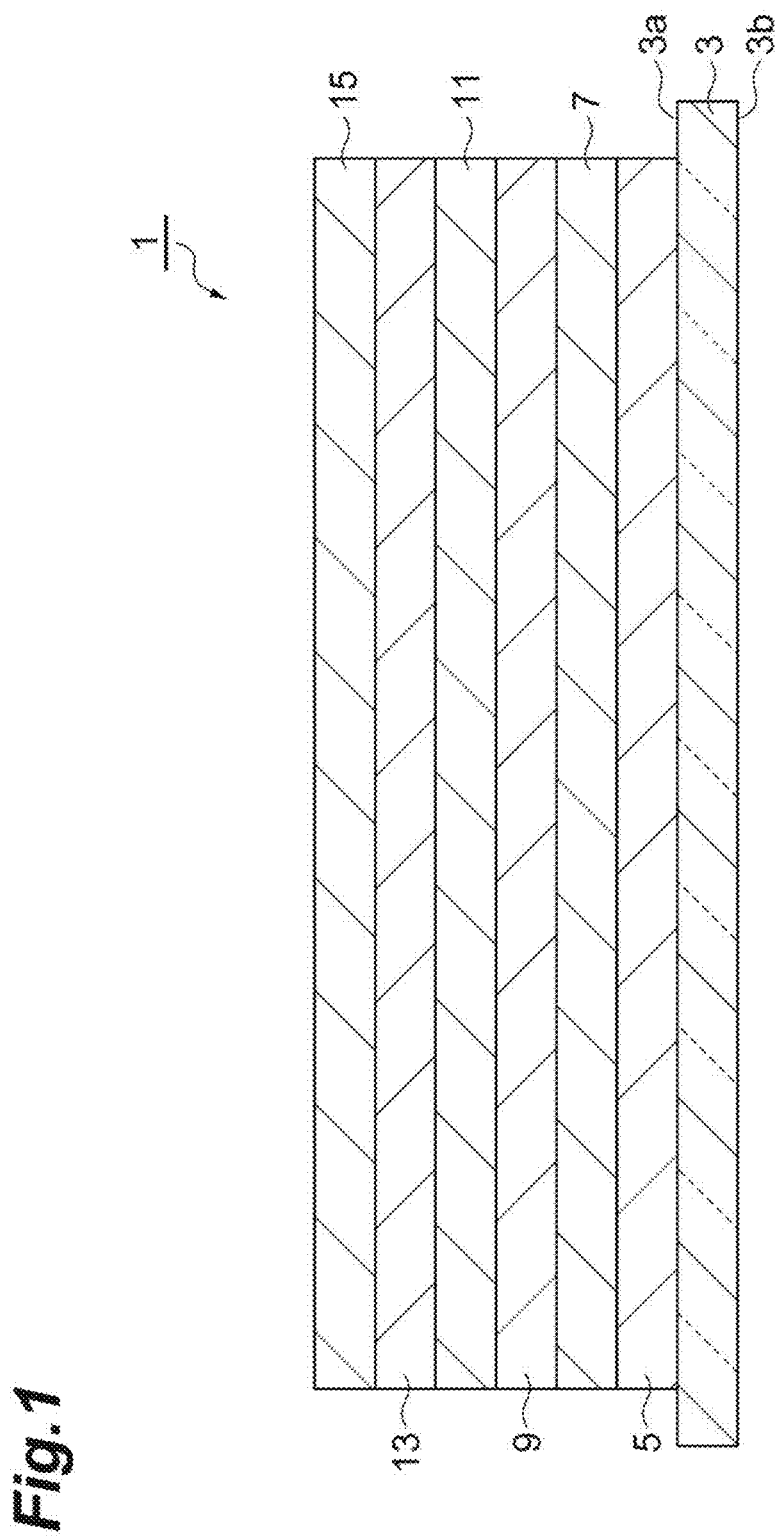
FIG. 1 is a diagram showing a cross-sectional configuration of an organic light-emitting diode produced by a method for producing an organic device according to one embodiment.

Exemplary embodiments of the present invention will be described below in detail with reference to the appended drawings. Here, the same or corresponding components are denoted with the same reference numerals in the following description, and redundant descriptions thereof will be omitted.

In one embodiment of the present invention, as shown in FIG. 1, an organic light-emitting diode (organic device) 1 includes a support substrate 3, an anode layer (first electrode layer) 5, a hole injection layer (organic functional layer) 7, a hole transport layer (organic functional layer) 9, a light emitting layer (organic functional layer) 11, an electron injection layer (organic functional layer) 13, and a cathode layer (second electrode layer) 15.

The organic light-emitting diode 1 may have a form in which light is emitted from the side of the support substrate 3 or a form in which light is emitted from the side opposite to the support substrate 3. Hereinafter, the organic light-emitting diode 1 in a form in which light is emitted from the side of the support substrate 3 will be described.

[Support Substrate]

The support substrate 3 is formed of a member having translucency with respect to visible light (light with a wavelength of 400 nm to 800 nm). Examples of the support substrate 3 include glass and the like. When the support substrate 3 is glass, the thickness thereof is, for example, 0.05 mm to 1.1 mm.

The support substrate 3 may be made of a resin, and may be, for example, a film-like substrate (a flexible substrate and a substrate having flexibility). In this case, the thickness of the support substrate 3 is, for example, 30 μm or more and 500 μm or less. When the support substrate 3 is made of a resin, the thickness thereof is preferably 45 μm or more in consideration of substrate deflection, wrinkles, and elongation during a continuous roll-to-roll method, and is preferably 125 μm or less in consideration of flexibility.

When the support substrate 3 is made of a resin, examples of materials thereof include a plastic film. Examples of materials of the support substrates 3 include polyether sulfone (PES); polyester resins such as polyethylene terephthalate (PET) and polyethylene naphthalate (PEN); polyolefin resins such as polyethylene (PE), polypropylene (PP), and cyclic polyolefins; polyamide resins; polycarbonate resins; polystyrene resins; polyvinyl alcohol resins; saponified products of ethylene-vinyl acetate copolymers; polyacrylonitrile resins; acetal resins; polyimide resins; and epoxy resins.

Regarding the material of the support substrate 3, among the above resins, a polyester resin or a polyolefin resin is preferable and polyethylene phthalate or polyethylene naphthalate is more preferable because heat resistance thereof is high, the coefficient of linear expansion is low, and the production costs are low. In addition, these resins may be used alone or two or more thereof may be used in combination.

A gas barrier layer or a water barrier layer (barrier layer) may be disposed on one main surface 3a of the support substrate 3. The other main surface 3b of the support substrate 3 is a light emitting surface. A light extraction film may be provided on the other main surface 3b.

[Anode Layer]

The anode layer 5 is disposed on one main surface 3a of the support substrate 3. An electrode layer exhibiting light transmission is used for the anode layer 5. Regarding an electrode exhibiting light transmission, a thin film made of a metal oxide, a metal sulfide or a metal having high electrical conductivity can be used, and a thin film having high light transmittance is suitably used. For example, thin films made of indium oxide, zinc oxide, tin oxide, indium tin oxide (abbreviation ITO), indium zinc oxide (abbreviation IZO), gold, platinum, silver, copper, or the like are used. Among these, a thin film made of ITO, IZO, or tin oxide is suitably used. Regarding the anode layer 5, a transparent conductive film of an organic material such as polyaniline and derivatives thereof, polythiophene and derivatives thereof may be used.

The thickness of the anode layer 5 can be determined in consideration of light transmission, electrical conductivity, and the like. The thickness of the anode layer 5 is 10 nm or more and 10 μm or less, preferably 20 nm or more and 1 μm or less, and more preferably 50 nm or more and 500 nm or less.

Examples of a method for forming the anode layer 5 include a vacuum deposition method, a sputtering method, an ion plating method, a plating method and a coating method. Examples of coating methods include a spin coating method, a casting method, a microgravure coating method, a gravure coating method, a bar coating method, a roll coating method, a wire bar coating method, a dip coating method, a spray coating method, a screen printing method, a flexographic printing method, an offset printing method, and an inkjet printing method.

[Hole Injection Layer]

The hole injection layer 7 is disposed on a main surface (side opposite to the surface in contact with the support substrate 3) of the anode layer 5. The hole injection layer 7 is a functional layer having a function of improving efficiency of hole injection from the anode layer 5 to the light emitting layer 11. Examples of materials constituting the hole injection layer 7 include oxides such as vanadium oxide, molybdenum oxide, ruthenium oxide, and aluminum oxide, and a phenylamine compound, a starburst type amine compound, a phthalocyanine compound, amorphous carbon, polyaniline, and polythiophene derivatives such as polyethylene dioxythiophene (PEDOT).

A conventionally known organic material having a charge transporting property can be used as a material of the hole injection layer 7 by combining it with an electron-accepting material. Regarding the electron-accepting material, a heteropoly acid compound or an aryl sulfonic acid can be suitably used.

A heteropoly acid compound has a structure in which a heteroatom is positioned at the center of a molecule, which is represented by a Keggin type or Dawson type chemical structure, and is a polyacid obtained by condensing an isopoly acid, which is an oxyacid of such as vanadium (V), molybdenum (Mo), and tungsten (W), with an oxyacid of a heteroelement. Examples of oxyacids of heteroelements mainly include oxyacids of silicon (Si), phosphorus (P), and arsenic (As). Specific examples of heteropoly acid compounds include phosphomolybdic acid, silicomolybdic acid, phosphotungstic acid, phosphotungstomolybdic acid and silicotungstic acid.

Examples of aryl sulfonic acids include benzenesulfonic acid, tosylic acid, p-styrenesulfonic acid, 2-naphthalenesulfonic acid, 4-hydroxybenzenesulfonic acid, 5-sulfosalicylic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalenesulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, and 2,7-dinonyl-4,5-naphthalenedisulfonic acid. A heteropoly acid compound and an aryl sulfonic acid may be used in combination.

The thickness of the hole injection layer 7 is, for example, 1 nm or more and 1 μm or less, preferably 2 nm or more and 500 nm or less, and more preferably 5 nm or more and 200 nm or less.

The hole injection layer 7 is formed by, for example, a coating method using a coating solution containing the above materials.

Examples of coating methods include a spin coating method, a casting method, a microgravure coating method, a gravure coating method, a bar coating method, a roll coating method, a wire bar coating method, a dip coating method, a spray coating method, a screen printing method, a flexographic printing method, an offset printing method, and an inkjet printing method. The hole injection layer 7 can be formed by applying a coating solution onto the anode layer 5 using one of these coating methods.

[Hole Transport Layer]

The hole transport layer 9 is disposed on a main surface (surface opposite to the surface in contact with the anode layer 5) of the hole injection layer 7. The hole transport layer 9 is a functional layer having a function of improving efficiency of hole injection from the hole transport layer 9 closer to the hole injection layer 7 or the anode layer 5 to the light emitting layer 11. Regarding materials of the hole transport layer 9, known hole transport materials can be used. Examples of materials of the hole transport layer 9 include polyvinyl carbazole or derivatives thereof, polysilane or derivatives thereof, polysiloxanes having an aromatic amine in a side chain or a main chain or derivatives thereof, pyrazoline or derivatives thereof, arylamine or derivatives thereof, stilbene or derivatives thereof, triphenyldiamine or derivatives thereof, polyaniline or derivatives thereof, polythiophene or derivatives thereof, polyarylamine or derivatives thereof, polypyrrole or derivatives thereof, poly(p-phenylene vinylene) or derivatives thereof, and poly(2,5-thienylenevinylene) or derivatives thereof.

The optimum value of the thickness of the hole transport layer 9 differs depending on materials used, and is appropriately set so that a drive voltage and luminous efficiency have appropriate values. The thickness of the hole transport layer 9 is, for example, 1 nm to 1 μm, preferably 2 nm to 500 nm, and more preferably 5 nm to 200 nm.

Examples of a method for forming the hole transport layer 9 include a coating method using a coating solution containing the above materials. Examples of a coating method include a method exemplified for the hole injection layer 7. Any solvent for a coating solution may be used as long as it dissolves the above material, and examples thereof include chlorine-containing solvents such as chloroform, methylene chloride, and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate, and ethyl cellosolve acetate.

[Light Emitting Layer]

The light emitting layer 11 is a functional layer that emits light (including visible light) and is disposed on a main surface (surface opposite to the surface in contact with the hole injection layer 7) of the hole transport layer 9. The light emitting layer 11 generally contains an organic material that mainly emits fluorescence and/or phosphorescence or the organic material and a dopant material for a light emitting layer that assists the organic material. For example, the dopant material for a light emitting layer is added to improve luminous efficiency or change a light emission wavelength. Here, the organic material may be a low-molecular-weight compound or a high-molecular-weight compound. Examples of light-emitting materials constituting the light emitting layer 11 include an organic material that mainly emits fluorescence and/or phosphorescence and a dopant material for a light emitting layer such as the following dye materials, metal complex materials, and polymeric materials.

(Dye Materials)

Examples of dye materials include cyclopentamine and derivatives thereof, tetraphenylbutadiene and derivatives thereof, triphenylamine and derivatives thereof, oxadiazole and derivatives thereof, pyrazoloquinoline and derivatives thereof, distyrylbenzene and derivatives thereof, distyrylarylene and derivatives thereof, pyrrole and derivatives thereof, thiophene compounds, pyridine compounds, perinone and derivatives thereof, perylene and derivatives thereof, oligothiophene and derivatives thereof, oxadiazole dimer, pyrazoline dimer, quinacridone and derivatives thereof, and coumarin and derivatives thereof.

(Metal Complex Materials)

Examples of metal complex materials include metal complexes which contains a rare earth metal such as Tb, Eu, and Dy or Al, Zn, Be, Pt, or Ir as a central metal, and have an oxadiazole, thiadiazole, phenylpyridine, phenylbenzimidazole, or quinoline structure or the like in a ligand. Examples of metal complexes include metal complexes that emit light in a triplet excited state such as iridium complexes and platinum complexes, aluminum quinolinol complexes, benzoquinolinol beryllium complexes, benzoxazolyl zinc complexes, benzothiazole zinc complexes, azomethyl zinc complexes, porphyrin zinc complexes, and phenanthroline europium complexes.

(Polymeric Materials)

Examples of polymeric materials include polyparaphenylene vinylene and derivatives thereof, polythiophene and derivatives thereof, polyparaphenylene and derivatives thereof, polysilane and derivatives thereof, polyacetylene and derivatives thereof, polyfluorene and derivatives thereof, polyvinyl carbazole and derivatives thereof, and materials obtained by polymerizing the above dye materials or metal complex materials.

(Dopant Materials for Light Emitting Layer)

Examples of dopant materials for a light emitting layer include perylene and derivatives thereof, coumarin and derivatives thereof, rubrene and derivatives thereof, quinacridone and derivatives thereof, squarylium and derivatives thereof, porphyrin and derivatives thereof, styryl dyes, tetracene and derivatives thereof, pyrazolone and derivatives thereof, decacyclene and derivatives thereof, and phenoxazone and derivatives thereof.

The thickness of the light emitting layer 11 is generally, about 2 nm to 200 nm. For example, the light emitting layer 11 is formed by a coating method using a coating solution (for example, an ink) containing the above light-emitting material. A solvent for a coating solution containing a light-emitting material is not limited as long as it dissolves the light-emitting material.

[Electron Injection Layer]

The electron injection layer 13 is disposed on a main surface (surface opposite to the surface in contact with the hole transport layer 9) of the light emitting layer 11. The electron injection layer 13 is a functional layer having a function of improving efficiency of electron injection from the cathode layer 15 to the light emitting layer 11. Regarding the material of the electron injection layer 13, known electron injection materials are used, and examples thereof include alkali metals, alkaline earth metals, and alloys containing one or more of alkali metals and alkaline earth metals, oxides, halides, and carbonates of alkali metals or alkaline earth metals, and mixtures of these substances. Examples of alkali metals, and oxides, halides, and carbonates of alkali metals include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. In addition, examples of alkaline earth metals and oxides, halides, and carbonates of alkaline earth metals include magnesium, calcium, barium, strontium, magnesium oxide, magnesium fluoride, calcium oxide, calcium fluoride, barium oxide, barium fluoride, strontium oxide, strontium fluoride, and magnesium carbonate.

A material obtained by mixing a conventionally known organic material having an electron transporting property and an organic metal complex of an alkali metal can also be used as an electron injection material.

The thickness of the electron injection layer 13 is, for example, 1 to 50 nm.

Examples of a method for forming the electron injection layer 13 include a vacuum deposition method.

[Cathode Layer]

The cathode layer 15 is disposed on a main surface (side opposite to the surface in contact with the light emitting layer 11) of the electron injection layer 13. Regarding the material of the cathode layer 15, for example, alkali metals, alkaline earth metals, transition metals and metals in Group 13 in the periodic table can be used. Regarding the material of the cathode layer 15, specifically, for example, a metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, an alloy of two or more of the above metals, an alloy of one or more of the above metals and one or more of gold, silver, platinum, copper, manganese, titanium, cobalt, nickel, tungsten, and tin, or graphite or a graphite intercalation compound is used. Examples of alloys include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys.

In addition, for the cathode layer 15, for example, a transparent conductive electrode made of a conductive metal oxide, a conductive organic material, or the like can be used. Specific examples of conductive metal oxides include indium oxide, zinc oxide, tin oxide, ITO, and IZO, and examples of conductive organic materials include polyaniline and derivatives thereof, polythiophene and derivatives thereof. Here, the cathode layer 15 may have a laminate configuration in which two or more layers are laminated. Here, an electron injection layer may be used as the cathode layer 15.

The thickness of the cathode layer 15 is set in consideration of electrical conductivity and durability. The thickness of the cathode layer 15 is generally 10 nm to 10 µm, preferably 20 nm to 1 µm, and more preferably 50 nm to 500 nm. Examples of a method for forming the cathode layer 15 include a vacuum deposition method and a coating method.

[Method for Producing Organic Light-Emitting Diode]

Subsequently, a method for producing the organic light-emitting diode 1 having the above configuration will be described with reference to FIG. 2.

Figure 3:
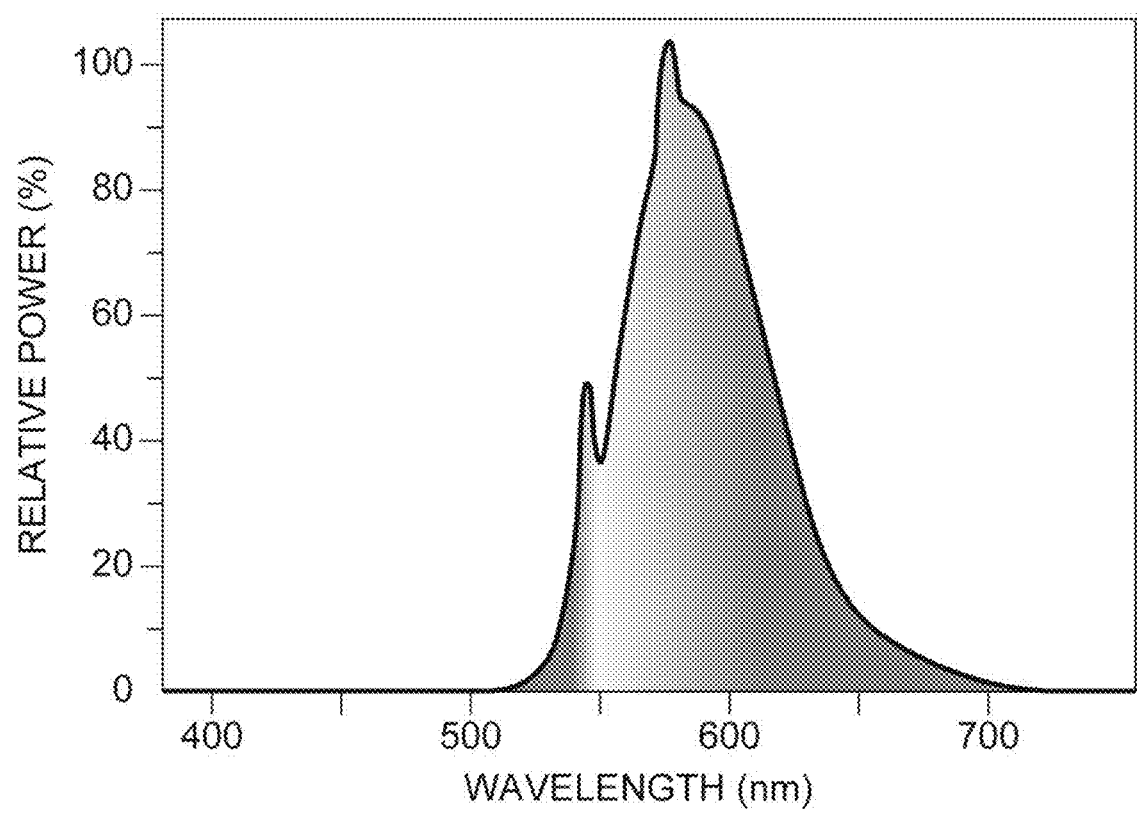
FIG. 3 is a diagram showing a relationship between a wavelength and a relative power of yellow light.

In a form in which the support substrate 3 is a substrate which has flexibility and extends in the longitudinal direction, in the method for producing the organic light-emitting diode 1, a roll-to-roll method can be adopted. When the organic light-emitting diode 1 is produced by a roll-to-roll method, layers are sequentially formed from the side of the support substrate 3 while continuously transporting the long flexible support substrate 3 stretched between an unwinding roller and a winding roller by a transport roller. In addition, in the present embodiment, the organic light-emitting diode 1 is produced under a yellow light environment. As shown in FIG. 3, yellow light is light that does not include light having a wavelength range of 500 nm or less (a wavelength of 500 nm or less is blocked).

Figure 2:
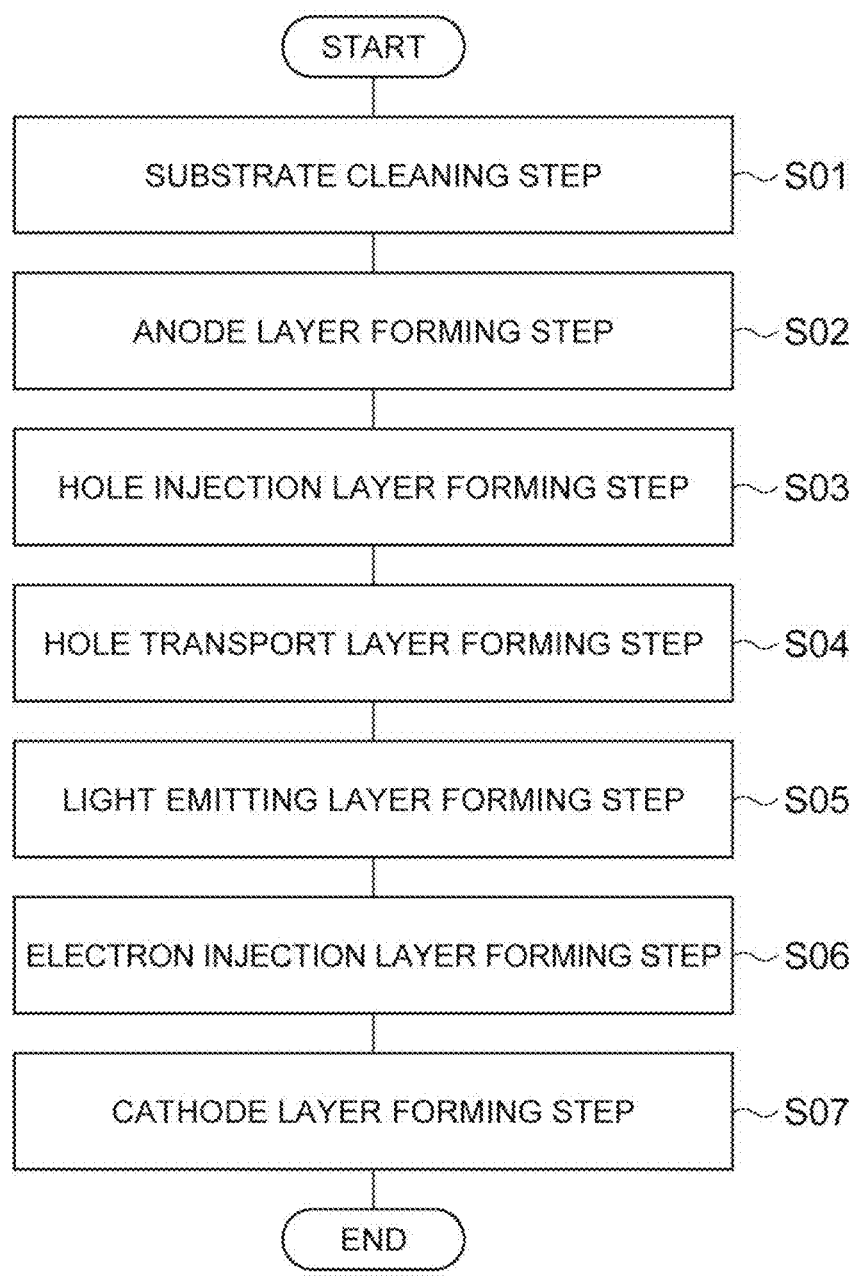
FIG. 2 is a flowchart showing a method for producing an organic light-emitting diode.

When the organic light-emitting diode 1 is produced, as shown in FIG. 2, the support substrate 3 is cleaned (substrate cleaning step S01). Examples of a method of cleaning the support substrate 3 include shower cleaning, brush cleaning, and dip cleaning. Next, the anode layer 5 is formed on the cleaned support substrate 3 (anode layer forming step S02). The anode layer 5 can be formed by the forming method exemplified in the description of the anode layer 5. Subsequently, the hole injection layer 7 and the hole transport layer 9 are formed on the anode layer 5 in this order (hole injection layer forming step S03, hole transport layer forming step S04). The hole injection layer 7 and the hole transport layer 9 can be formed by the forming method exemplified in the description of the hole injection layer 7 and the hole transport layer 9.

Figure 4:
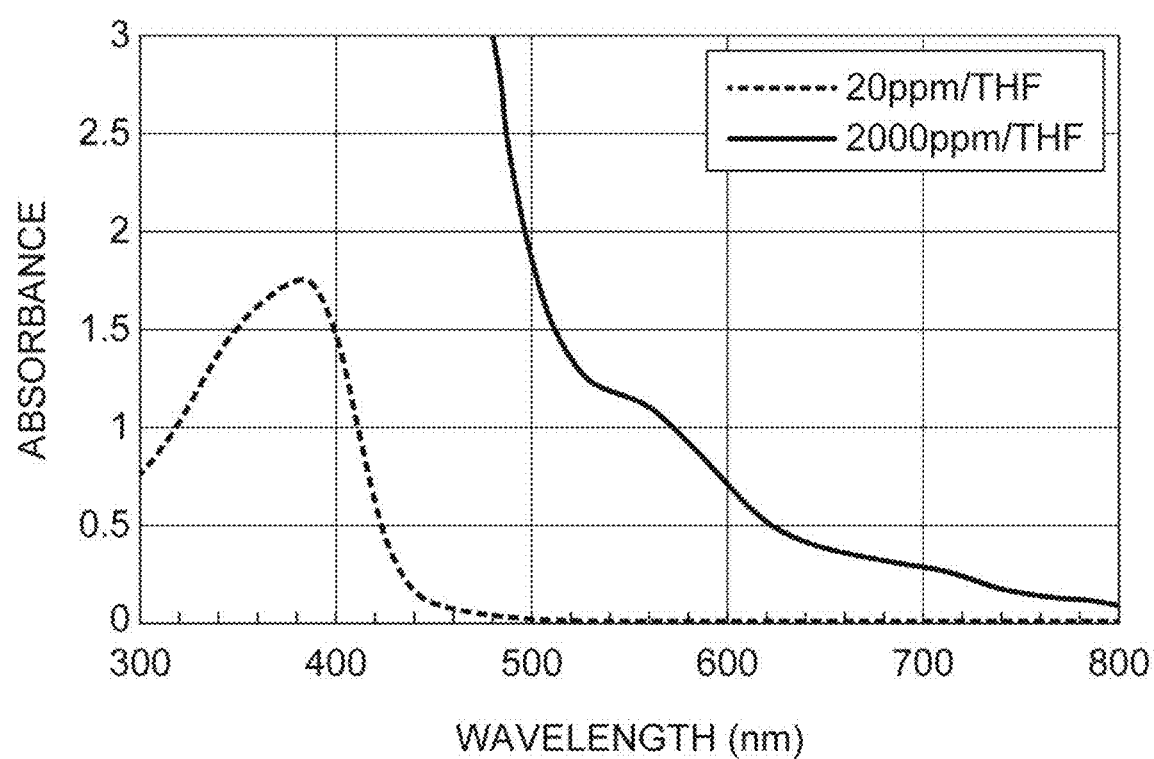
FIG. 4 is a diagram showing an absorption spectrum distribution of a light emitting layer.

Next, the light emitting layer 11 is formed on the hole transport layer 9 (light emitting layer forming step (first forming step) S05). The light emitting layer 11 can be formed by the forming method exemplified in the description of the light emitting layer 11. Specifically, the light emitting layer 11 is formed by a coating method using a coating solution in which a light-emitting material that forms the light emitting layer 11 is dissolved in an organic solvent. A wavelength of at least one peak of an emission spectrum of yellow light is within an absorption spectrum distribution of the coating solution. FIG. 4 is a diagram showing an absorption spectrum distribution of the light emitting layer. In FIG. 4, the abscissa represents wavelength [nm], and the ordinate represents absorbance. The absorbance is log (Io/I). Io is an incident light intensity, and I is a transmitted light intensity. FIG. 4 shows an example of a coating solution using 20 ppm or 2,000 ppm of THF (tetrahydrofuran) as an organic solvent.

In the present embodiment, an upper limit value of the integrated illuminance of light (incident light) that enters the light emitting layer 11 is set in an environment until formation of the cathode layer 15 starts after formation of the light emitting layer 11 starts (the coating solution is applied), and the organic functional layer (the light emitting layer 11 and the electron injection layer 13) is formed so that the integrated illuminance is the upper limit value or less. Specifically, the upper limit value of the integrated illuminance at which the product lifespan is a predetermined time or longer is set on the basis of the relationship of the integrated illuminance with relative lifespan and relative current luminous efficiency so that the product lifespan of the organic light-emitting diode 1 set based on the relative lifespan and the relative current luminous efficiency caused by the integrated illuminance is a predetermined time or longer. The integrated illuminance is a cumulative illuminance value of incident light (product of an illuminance and an emission time of incident light). The relative lifespan is a relative value of the lifespan when the lifespan of the organic light-emitting diode 1 is set as 100% when the integrated illuminance is "0 (zero)." The relative current luminous efficiency is a relative value of the current luminous efficiency when the current luminous efficiency of the organic light-emitting diode 1 is set as 100% when the integrated illuminance is "0 (zero)."

The product lifespan of the organic light-emitting diode 1 is calculated from the following formula.

$$LT = (LT_0) \times \Delta LT_t \times (\Delta \text{Eff}_t)^2$$

In the above formula, LT[khrs] is an estimated product lifespan of the organic light-emitting diode 1. $LT_0$ is a product lifespan when the integrated illuminance is "0" under a yellow light environment. $\Delta LT_t$ is a relative lifespan at an integrated illuminance when yellow light enters the organic light-emitting diode 1 for a predetermined time "t" under a yellow light environment. $\Delta \text{Eff}_t$ is a relative current luminous efficiency at an integrated illuminance when yellow light enters the organic light-emitting diode 1 for a predetermined time "t" under a yellow light environment.

Figure 5:
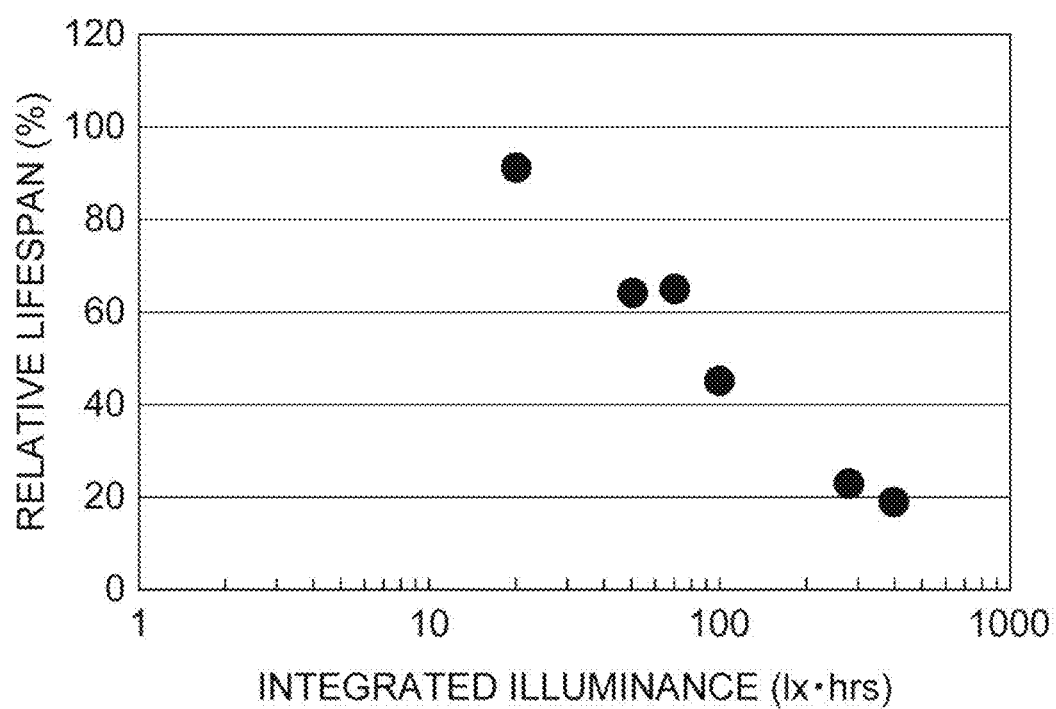
FIG. 5 is a diagram showing a relationship between an integrated illuminance and a relative lifespan.
Figure 6:
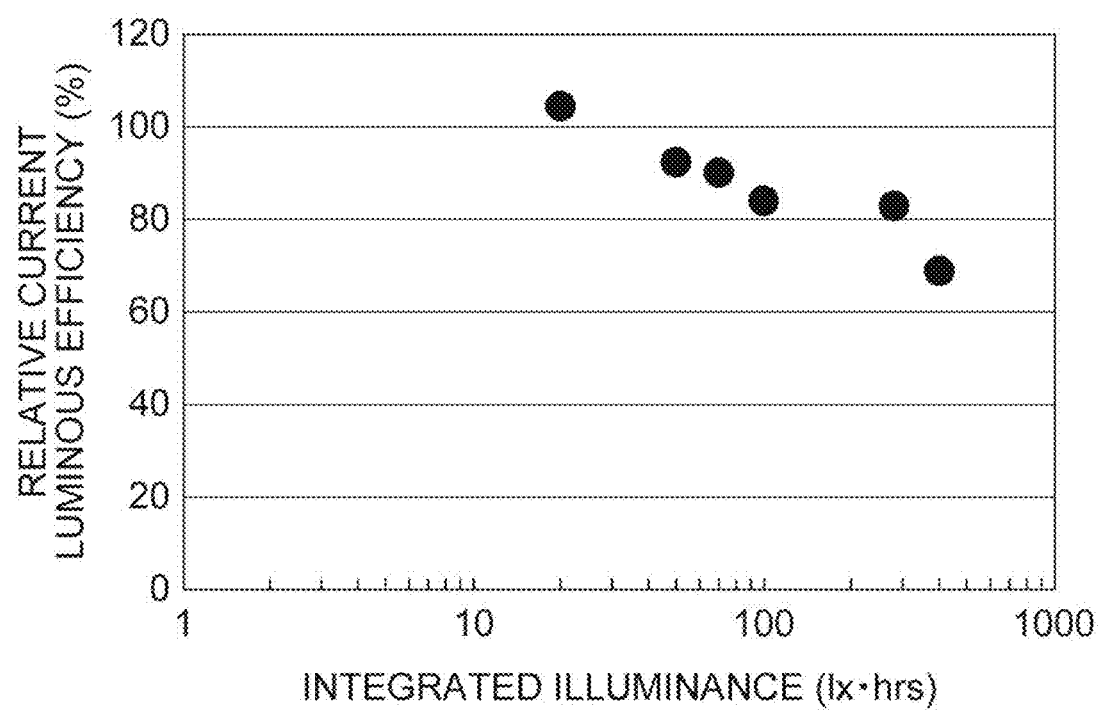
FIG. 6 is a diagram showing a relationship between an integrated illuminance and a relative current luminous efficiency.

FIG. 5 is a diagram showing a relationship between the integrated illuminance and the relative lifespan in the present embodiment. In FIG. 5, the abscissa represents integrated illuminance [lx·hrs], and the ordinate represents relative lifespan [%] FIG. 6 is a diagram showing a relationship between the integrated illuminance and the relative current luminous efficiency in the present embodiment. In FIG. 6, the abscissa represents integrated illuminance [lx·hrs], and the ordinate represents relative current luminous efficiency [%]. FIG. 7 is a table showing the integrated illuminance, the relative lifespan, and the relative current luminous efficiency in the present embodiment. FIG. 5 to FIG. 7 show seven samples as an example. In FIG. 5 and FIG. 6, plots in which the integrated illuminance is "0," which is indicated by "1" in FIG. 7 are omitted. As shown in FIG. 9, when the integrated illuminance is "0," the product lifespan of the organic light-emitting diode 1 is, for example, 140 [khrs]. The relationship between the integrated illuminance and the relative lifespan and the relationship between the integrated illuminance and the relative current luminous efficiency can be obtained by, for example, experiments, tests, and the like. The relationship between the integrated illuminance and the relative lifespan and the relationship between the integrated illuminance and the relative current luminous efficiency can be obtained in a step before forming the organic functional layer (in the present embodiment, the light emitting layer 11 and the electron injection layer 13).

As shown in FIG. 7, when the integrated illuminance is "0," the relative current luminous efficiency and the relative lifespan are "100(%)." As shown in FIG. 5 and FIG. 7, when the integrated illuminance increases, the relative lifespan tends to decrease. As shown in FIG. 6 and FIG. 7, when the integrated illuminance increases, the relative current luminous efficiency tends to decrease. For example, when the integrated illuminance is "100 (lx·hrs)," the relative lifespan is "45(%)" and the relative current luminous efficiency is "84(%)." When the relative current luminous efficiency is "84(%)," in order to output the rated luminance in the organic light-emitting diode 1, the current value becomes 1.19 times (1/0.84). When an increasing current is supplied to the organic light-emitting diode 1, the lifespan of the organic light-emitting diode 1 is shortened by the square of the current value.

Figure 8:
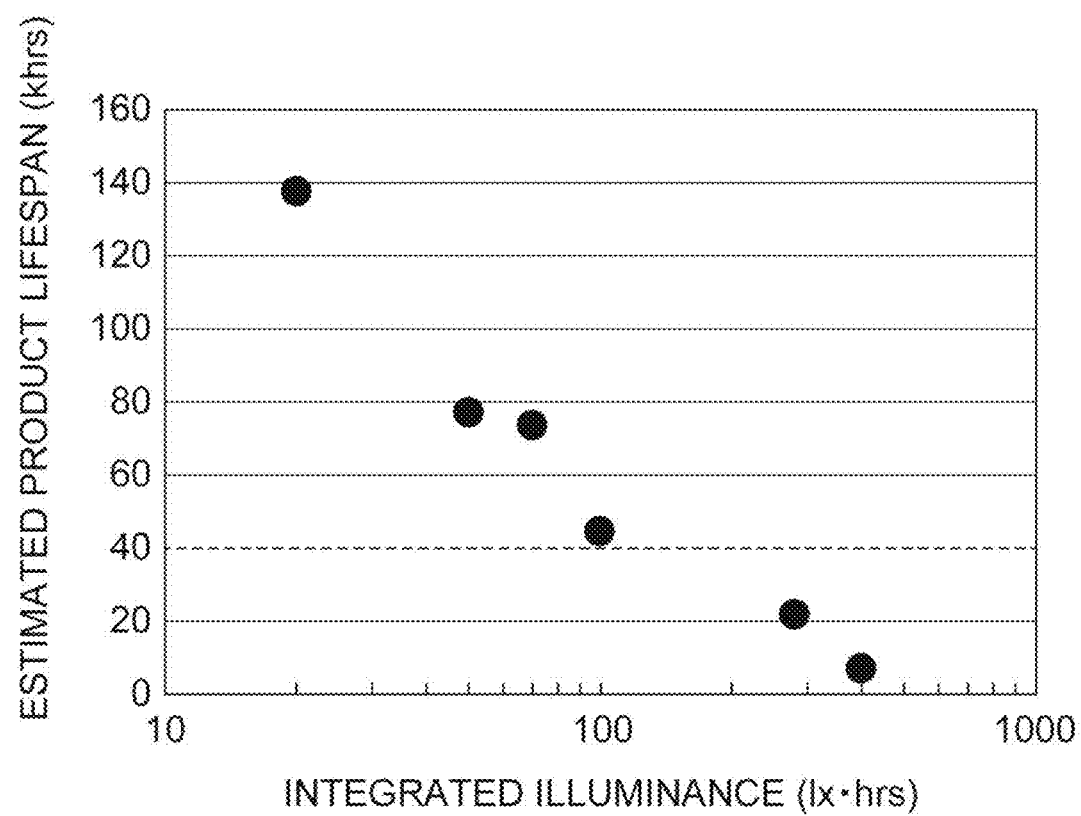
FIG. 8 is a diagram showing a relationship between an integrated illuminance and an estimated product lifespan.

FIG. 8 and FIG. 9 show the product lifespan calculated from the above formula based on the relative current luminous efficiency and the relative lifespan shown in FIG. 5 to FIG. 7. FIG. 8 is a diagram showing a relationship between the integrated illuminance and the product lifespan. In FIG. 8, the abscissa represents integrated illuminance [lx·hrs], and the ordinate represents product lifespan [khrs]. FIG. 9 is a table showing a relationship between the integrated illuminance and the product lifespan.

When the organic light-emitting diode 1 is used for lighting or the like, the product lifespan is preferably 40 [khrs] (40,000 hours) or more (indicated by a dotted line in FIG. 8). As shown in FIG. 9, in the present embodiment, the product lifespan is 40 [khrs] when the integrated illuminance is 100 [lx·hrs] or less. As described above, in the present embodiment, the upper limit value of the integrated illuminance is preferably set to 100 [lx·hrs] so that the product lifespan of the organic light-emitting diode 1 is 40 [khrs] or more. That is, the integrated illuminance of light in an environment until formation of the cathode layer 15 starts after formation of the light emitting layer 11 starts is preferably 100 [lx·hrs] or less.

Subsequently, as shown in FIG. 2, the electron injection layer 13 is formed on the light emitting layer 11 (electron injection layer forming step S06). The electron injection layer 13 can be firmed by the forming method exemplified in the description of the electron injection layer 13. Then, the cathode layer 15 is formed on the electron injection layer 13 (cathode layer forming step (second forming step) S07). The cathode layer 15 can be formed by the forming method exemplified in the description of the cathode layer 15. Then, a sealing member (not shown) is attached to the cathode layer 15 and the support substrate 3 is cut to separate the organic light-emitting diode 1 into pieces. Therefore, the organic light-emitting diode 1 is produced.

As described above, in the method for producing the organic light-emitting diode 1 according to the present embodiment, the upper limit value of the integrated illuminance at which the product lifespan is a predetermined time or longer is set on the basis of the relationship of the integrated illuminance with relative lifespan and relative current luminous efficiency so that the product lifespan of the organic light-emitting diode 1 is a predetermined time or longer. Then, in the method for producing the organic light-emitting diode 1, the organic functional layer (the light emitting layer 11 and the electron injection layer 13) is formed so that the integrated illuminance of light that enters the light emitting layer 11 is an upper limit value or less. Thereby, in the method for producing the organic light-emitting diode 1, it is possible to produce the organic light-emitting diode 1 having a product lifespan of a predetermined time or longer. Therefore, in the method for producing the organic light-emitting diode 1, it is possible to reduce a decrease in the reliability.

Specifically, in the method for producing the organic light-emitting diode 1 according to the present embodiment, layers from the light emitting layer 11 to the cathode layer 15 are formed so that the integrated illuminance of light is 100 lx·hrs or less. Thereby, in the method for producing the organic light-emitting diode 1, it is possible to produce the organic light-emitting diode 1 having a product lifespan of 40 [khrs] or more.

In the method for producing the organic light-emitting diode 1 according to the present embodiment, a wavelength of at least one peak of an emission spectrum of light that can enter the light emitting layer 11 is within a distribution of an absorption spectrum of a material that forms the light emitting layer 11 dissolved in the organic solvent. Therefore, when a peak wavelength of an emission spectrum of light is included in the distribution of the absorption spectrum of the material that forms the light emitting layer 11, the method for producing the organic light-emitting diode 1 is particularly effective.

In the method for producing the organic light-emitting diode 1 according to the present embodiment, light that can enter the light emitting layer 11 does not have a wavelength range of 500 nm or less. In production of the organic light-emitting diode 1, a material having high sensitivity in a short wavelength range may be used. Therefore, when so-called yellow light in which light having a wavelength shorter than 500 nm is cut is used, since it is possible to minimize a reaction of a material having high sensitivity in a short wavelength range, it is possible to prevent light from affecting characteristics of the organic light-emitting diode 1.

While embodiments of the present invention have been described above, the present invention is not necessarily limited to the above embodiments, and various modifications can be made without departing from the spirit and scope of the invention.

For example, the organic light-emitting diode 1 in which the anode layer 5, the hole injection layer 7, the hole transport layer 9, the light emitting layer 11, the electron injection layer 13 and the cathode layer 15 are disposed in this order has been exemplified in the above embodiment. However, the configuration of the organic light-emitting diode 1 is not limited thereto. The organic light-emitting diode 1 may have the following configuration.

(a) Anode layer/light emitting layer/cathode layer
(b) Anode layer/hole injection layer/light emitting layer/cathode layer
(c) Anode layer/hole injection layer/light emitting layer/electron injection layer/cathode layer
(d) Anode layer/hole injection layer/light emitting layer/electron transport layer/electron injection layer/cathode layer
(e) Anode layer/hole injection layer/hole transport layer/light emitting layer/cathode layer
(f) Anode layer/hole injection layer/hole transport layer/light emitting layer/electron injection layer/cathode layer (g) Anode layer/hole injection layer/hole transport layer/light emitting layer/electron transport layer/electron injection layer/cathode layer (h) Anode layer/light emitting layer/electron injection layer/cathode layer (i) Anode layer/light emitting layer/electron transport layer/electron injection layer/cathode layer Here, the symbol "/" indicates that layers between which the symbol "/" is interposed are laminated adjacent to each other. The above (f) shows a configuration of the above embodiment.

The electron transport layer is a functional layer having a function of improving efficiency of electron injection from the electron transport layer closer to the cathode layer, the electron injection layer or the cathode to the light emitting layer. The thickness of the electron transport layer is appropriately set in consideration of electrical characteristics and/or ease of film formation, and is, for example, 1 nm to 1 μm, preferably 2 nm to 500 nm, and more preferably 5 nm to 200 nm.

Known materials can be used for the electron transport material constituting the electron transport layer. Examples of electron transport materials that constitute the electron transport layer include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or derivatives thereof, polyquinoline or derivatives thereof, polyquinoxaline or derivatives thereof, and polyfluorene or derivatives thereof.

Examples of a method for forming an electron transport layer include a method exemplified for the anode layer 5.

The organic light-emitting diode 1 may have one organic functional layer, or may have a plurality (two or more) of organic functional layers. In any one of the above (a) to (i) layer configurations, when a lamination structure disposed between the anode layer 5 and the cathode layer 15 is set as a "structural unit A," as a configuration of an organic light-emitting diode including two organic functional layers, for example, a layer configuration shown in the following (j) may be exemplified. Two layer configurations (structural unit A) may be the same as or different from each other. The charge generation layer is a layer that generates a hole and an electron when an electric field is applied. Examples of the charge generation layer include a thin film made of vanadium oxide, ITO, molybdenum oxide, or the like.

(j) Anode layer/(structural unit A)/charge generation layer/(structural unit A)/cathode layer In addition, when "(structural unit A)/charge generation layer" is set as a "structural unit B," as a configuration of an organic light-emitting diode including two or more light emitting layers 11, for example, a layer configuration shown in the following (k) may be exemplified.

(k) Anode layer/(structural unit B)x/(structural unit A)/cathode layer

The symbol "x" denotes an integer of 2 or more, and "(structural unit B)x" denotes a laminate in which x (structural units B) are laminated. In addition, a plurality of (structural unit B) layer configurations may be the same as or different from each other.

A plurality of organic functional layers may be directly laminated without providing the charge generation layer to form an organic light-emitting diode.

In the above embodiment, a form in which the organic light-emitting diode 1 is produced under an environment of yellow light that does not have a wavelength range of 500 nm or less has been described as an example. However, the organic device may be produced under an environment of light other than yellow light. In this case, the upper limit value of the integrated illuminance may be set based on an emission spectrum of light and the absorption spectrum of the light emitting layer.

In the above embodiment, a form in which the first electrode layer is the anode layer 5, and the second electrode layer is the cathode layer 15 has been described as an example. However, the first electrode layer may be a cathode layer, and the second electrode layer may be an anode layer.

In the above embodiment, a form in which the electron injection layer 13 is formed after the light emitting layer 11 is formed, and the cathode layer 15 is formed after the electron injection layer 13 is formed has been described as an example. However, the support substrate 3 on which the organic functional layer is formed may be temporarily stored until formation of the cathode layer 15 starts after the light emitting layer 11 (the electron injection layer 13) is formed. In this case, the support substrate 3 on which the organic functional layer is formed may be stored under an environment in which the integrated illuminance is equal to or less than the upper limit value.

In the above embodiment, a form in which the upper limit value of the integrated illuminance of light is set in an environment until formation of the cathode layer 15 starts after formation of the light emitting layer 11 starts, and the organic functional layer is formed so that the integrated illuminance is the upper limit value or less has been described as an example. However, in a step of forming the organic functional layer formed before the light emitting layer is formed, the upper limit value of the integrated illuminance of light may be set, and the organic functional layer may be formed so that the integrated illuminance is the upper limit value or less.

In the above embodiment, a form in which the upper limit value of the integrated illuminance of light is set in an environment until formation of the cathode layer 15 starts after formation of the light emitting layer 11 starts has been described as an example. However, instead of setting the upper limit value of the integrated illuminance, the upper limit value of the integrated absorption irradiance of light may be set in an environment until formation of the cathode layer 15 starts after formation of the light emitting layer 11 starts. That is, the upper limit value of the integrated absorption irradiance of light is set in an environment until formation of the cathode layer 15 starts after formation of the light emitting layer 11 starts, and the organic functional layer may be formed so that the integrated absorption irradiance is the upper limit value or less.

The integrated absorption irradiance is an integrated value of integrated irradiances for wavelengths of light of a material that forms the light emitting layer 11. The integrated irradiance for wavelengths of light of the material that forms the light emitting layer 11 is obtained by multiplying an absorption rate for wavelengths of light of the material that forms the light emitting layer 11 by the integrated irradiance for wavelengths of light in an environment until formation of the cathode layer 15 starts after formation of the light emitting layer 11 starts as a weight. Here, the integrated irradiance is a cumulative irradiance value of light (a product of the irradiance and the emission time of light). The integrated absorption irradiance can be calculated by integrating integrated irradiances for wavelengths of light of a material that forms the light emitting layer 11 for all wavelengths. The upper limit value of the integrated absorption irradiance at which a product lifespan is a predetermined time or longer is set on the basis of a relationship of the integrated absorption irradiance with relative lifespan and relative current luminous efficiency so that the product lifespan of the organic device set based on the relative lifespan and the relative current luminous efficiency caused by the integrated absorption irradiance is a predetermined time or longer. The relationship of the integrated absorption irradiance with relative lifespan and the relative current luminous efficiency can be obtained by experiments, tests, and the like in the same manner as in the above integrated illuminance. In addition, the relationship between the integrated absorption irradiance and the relative lifespan and the relationship between the integrated absorption irradiance and the relative current luminous efficiency can be obtained in a step before forming the organic functional layer (in the present embodiment, the light emitting layer 11 and the electron injection layer 13).

In the above embodiment, the organic light-emitting diode has been described as an example of the organic device. The organic device may be an organic thin film transistor, an organic photodetector, an organic thin film solar cell, or the like.

REFERENCE SIGNS LIST

1 Organic light-emitting diode (organic device)
3 Support substrate
5 Anode layer (first electrode layer)
7 Hole injection layer (organic functional layer)
9 Hole transport layer (organic functional layer)
11 Light emitting layer (organic functional layer)
13 Electron injection layer (organic functional layer)
15 Cathode layer (second electrode layer)

The invention claimed is:

1. A method for producing an organic device, comprising:
a first forming step of forming an organic functional layer including at least a light emitting layer on a first electrode layer disposed on a substrate; and
a second forming step of forming a second electrode layer on the organic functional layer,
wherein an upper limit value of an integrated illuminance of light in an environment until formation of the second electrode layer starts in the second forming step after formation of the light emitting layer starts in the first forming step is set, and the organic functional layer is formed so that the integrated illuminance is the upper limit value or less, and
wherein the upper limit value of the integrated illuminance at which a product lifespan is a predetermined time or longer is set on the basis of a relationship of the integrated illuminance with relative lifespan and relative current luminous efficiency so that the product lifespan of the organic device set based on the relative lifespan and the relative current luminous efficiency caused by the integrated illuminance is the predetermined time or longer.

2. The method for producing an organic device according to claim 1,
wherein, if the product lifespan of the organic device when the integrated illuminance is 0 is set as $LT_0$, a relative lifespan at the integrated illuminance when the light enters the organic device for a predetermined time t is set as $\Delta LT_t$, and a relative current luminous efficiency at the integrated illuminance when the light enters the organic device for the predetermined time t is set as $\Delta Eff_t$, the product lifespan LT of the organic device is calculated from the following formula:

$$LT = (LT_0) \times \Delta LT_t \times (\Delta Eff_t)^2.$$

3. The method for producing an organic device according to claim 1,
wherein the upper limit value of the integrated illuminance is 100 lx·hrs or less.

4. A method for producing an organic device, comprising:
a first forming step of forming an organic functional layer including at least a light emitting layer on a first electrode layer disposed on a substrate; and
a second forming step of forming a second electrode layer on the organic functional layer,
wherein an upper limit value of an integrated absorption irradiance of light in an environment until formation of the second electrode layer starts in the second forming step after formation of the light emitting layer starts in the first forming step is set and the organic functional layer is found so that the integrated absorption irradiance is the upper limit value or less,
wherein the integrated absorption irradiance is an integrated value of integrated irradiances for wavelengths of the light of a material that forms the light emitting layer, and
wherein the upper limit value of the integrated absorption irradiance at which a product lifespan is a predetermined time or longer is set on the basis of a relationship of the integrated absorption irradiance with relative lifespan and relative current luminous efficiency so that the product lifespan of the organic device set based on the relative lifespan and the relative current luminous efficiency caused by the integrated absorption irradiance is the predetermined time or longer.

5. The method for producing an organic device according to claim 1,
wherein a wavelength of at least one peak of an emission spectrum of the light is within a distribution of an absorption spectrum of the material that forms the light emitting layer.

6. The method for producing an organic device according to claim 1,
wherein the light does not have a wavelength range of 500 nm or less.

7. The method for producing an organic device according to claim 4,
wherein a wavelength of at least one peak of an emission spectrum of the light is within a distribution of an absorption spectrum of the material that forms the light emitting layer.

8. The method for producing an organic device according to claim 4,
wherein the light does not have a wavelength range of 500 nm or less.

* * * * *